United States Patent
Riihihuhta et al.

(10) Patent No.: US 10,476,538 B2
(45) Date of Patent: Nov. 12, 2019

(54) METHOD OF CONTROLLING HARMONICS AND MOBILE TERMINAL PERFORMING THEREOF

(71) Applicant: LG ELECTRONICS INC., Seoul (KR)

(72) Inventors: Harri Riihihuhta, Turku (FI); Sami Vilhonen, Turku (FI); Samu Laaja, Turku (FI)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 15/999,317

(22) PCT Filed: Apr. 5, 2018

(86) PCT No.: PCT/KR2018/004033
§ 371 (c)(1),
(2) Date: Aug. 17, 2018

(87) PCT Pub. No.: WO2019/164052
PCT Pub. Date: Aug. 29, 2019

(65) Prior Publication Data
US 2019/0260408 A1    Aug. 22, 2019

Related U.S. Application Data

(60) Provisional application No. 62/633,613, filed on Feb. 22, 2018.

(51) Int. Cl.
*H04B 1/04*   (2006.01)
*H04B 1/12*   (2006.01)
(Continued)

(52) U.S. Cl.
CPC ............... *H04B 1/12* (2013.01); *H03D 7/165* (2013.01); *H04B 1/1036* (2013.01);
(Continued)

(58) Field of Classification Search
CPC ........ H04B 1/0475; H04B 1/04; H04B 1/401; H04B 17/0007; H04B 2001/0491
See application file for complete search history.

(56) References Cited

U.S. PATENT DOCUMENTS

2015/0030102 A1*   1/2015   Hormis .................. H04L 1/243
                                                                  375/296
2015/0031320 A1*   1/2015   Li .......................... H04B 1/123
                                                                  455/207
(Continued)

FOREIGN PATENT DOCUMENTS

EP        2779472        9/2014
JP    2012034406 A *    2/2012    ............. H03D 3/007
(Continued)

OTHER PUBLICATIONS

PCT International Application No. PCT/KR2018/004033, Notification of Transmittal of the International Search Report and the Written Opinion of the International Searching Authority, or Declaration dated Nov. 20, 2018, 11 pages.
(Continued)

*Primary Examiner* — Tuan Pham
(74) *Attorney, Agent, or Firm* — Lee, Hong, Degerman, Kang & Waimey PC

(57) ABSTRACT

A mobile terminal performing harmonic rejection includes a plurality of baseband units generating a baseband signal; a plurality of up-converters converting the baseband signal into a radio frequency (RF) signal; and a controller controlling phases of a plurality of signals applied to the plurality of baseband units and the plurality of up-converters. Meanwhile, the controller may perform at least one of a harmonic rejection mode, a first non-harmonic rejection mode for improving a signal-to-noise ratio (SNR), and a second non-harmonic rejection mode for improving linearity to
(Continued)

provide a transmitting part having improved harmonic distortion characteristics and the mobile terminal having the transmitting part.

9 Claims, 8 Drawing Sheets

(51) Int. Cl.
*H03D 7/16* (2006.01)
*H04B 17/336* (2015.01)
*H04B 1/10* (2006.01)

(52) U.S. Cl.
CPC ... *H04B 17/336* (2015.01); *H03D 2200/0086* (2013.01); *H04B 2001/1072* (2013.01)

(56) References Cited

U.S. PATENT DOCUMENTS

| | | | |
|---|---|---|---|
| 2015/0094004 A1* | 4/2015 | Vora | H03D 7/166 455/114.1 |
| 2015/0155907 A1* | 6/2015 | Shen | H04B 1/0475 375/297 |
| 2016/0349297 A1* | 12/2016 | van der Cammen | H03D 7/1433 |
| 2018/0183469 A1* | 6/2018 | Arnold | H04B 1/0475 |

FOREIGN PATENT DOCUMENTS

| | | | |
|---|---|---|---|
| KR | 20170117606 A * | 10/2017 | H03F 1/223 |
| KR | 1020170117606 | 10/2017 | |

OTHER PUBLICATIONS

Korean Intellectual Property Office Application No. 10-2018-7023844, Office Action dated Apr. 3, 2019, 5 pages.

* cited by examiner

OUTPUT @ f=LO AT THE
MOMENT WHEN I = 1 ( ≥ Q = 0)

OUTPUT @ f=3xLO AT THE
MOMENT WHEN I = 1 ( ≥ Q = 0)

OUTPUT @ f=5xLO AT THE
MOMENT WHEN I = 1 ( ≥ Q = 0)

⟶ 3rd & 5th LO HARMONICS ARE CANCELLED

METHOD OF CONTROLLING HARMONICS AND MOBILE TERMINAL PERFORMING THEREOF

CROSS-REFERENCE TO RELATED APPLICATIONS

This application is the National Stage filing under 35 U.S.C. 371 of International Application No. PCT/KR2018/004033, filed on Apr. 5, 2018, which claims the benefit of U.S. Provisional Application No. 62/633,613, filed on Feb. 22, 2018, the contents of which are all hereby incorporated by reference herein in their entirety.

TECHNICAL FIELD

The present disclosure relates to a method of controlling harmonics and a mobile terminal for performing the same, and particularly, to a mobile terminal having improved harmonic control characteristics in a transmitting part.

BACKGROUND ART

Terminals may be divided into mobile/portable terminals and stationary terminals according to mobility. Also, the mobile terminals may be classified into handheld types and vehicle mount types according to whether or not a user can directly carry.

Mobile terminals have become increasingly more functional. Examples of such functions include data and voice communications, capturing images and video via a camera, recording audio, playing music files via a speaker system, and displaying images and video on a display unit. Some mobile terminals include additional functionality which supports electronic game playing, while other terminals are configured as multimedia players. Specifically, in recent time, mobile terminals can receive broadcast and multicast signals to allow viewing of video or television programs.

As it becomes multifunctional, a mobile terminal can be allowed to capture still images or moving images, play music or video files, play games, receive broadcast and the like, so as to be implemented as an integrated multimedia player.

Efforts are ongoing to support and increase the functionality of mobile terminals. Such efforts include software and hardware improvements, as well as changes and improvements in the structural components.

In addition to the above attempts, wireless communication systems using LTE communication technologies have recently been commercialized to provide various services. Also, in the future, it is expected that a wireless communication system using 5G communication technology will be commercialized to provide various services. In this regard, a harmonic distortion signal is generated in a (frequency) up-converter (or down-converter) that converts a baseband signal or an intermediate frequency (IF) signal to an RF frequency signal to degrade performance of a communication system.

In this connection, a harmonic distortion phenomenon in the above-described up-converter is particularly remarkable in a multimode/multiband transmitting part. Recently, according to the tendency that communication systems are merged to a mobile terminal, the harmonic distortion phenomenon may increase. Therefore, such a multimode/multiband transmitting part needs to utilize a harmonic elimination structure to increase linearity in a specific operation mode.

In this connection, since a higher division ratio, i.e. a higher VCO frequency to be used, is required, such a structure may be restricted to a specific band (frequencies).

DISCLOSURE OF THE INVENTION

Therefore, an aspect of the detailed description is to provide solve the above-mentioned problems and other problems. Another aspect of the detailed description is to provide a transmitting part with improved harmonic distortion characteristics, and a mobile terminal.

Another aspect of the detailed description is to provide a transmitting part with improved SNR characteristics and linearity, while improving harmonic characteristics, and a mobile terminal.

To achieve these and other advantages and in accordance with the purpose of this specification, as embodied and broadly described herein, a mobile terminal performing harmonic rejection includes: a plurality of baseband units generating a baseband signal; a plurality of up-converters converting the baseband signal into a radio frequency (RF) signal; and a controller controlling phases of a plurality of signals applied to the plurality of baseband units and the plurality of up-converters. Meanwhile, the controller may perform at least one of a harmonic rejection mode, a first non-harmonic rejection mode for improving a signal-to-noise ratio (SNR), and a second non-harmonic rejection mode for improving linearity to provide a transmitting part having improved harmonic distortion characteristics and the mobile terminal having the transmitting part.

According to an embodiment, the plurality of baseband units may include first to fourth baseband units, the plurality of up-converters may include first to fourth up-converters, and in the harmonic rejection mode, the controller may control to apply first to fourth baseband signals having phases of 45, 0, 90, −45 to the first to fourth baseband units, respectively, and to apply first to fourth local oscillator (LO) signals having phases of 45, 0, 90, −45 to the first to fourth up-converters, respectively.

According to an embodiment, in the first non-harmonic rejection mode, the controller may control to apply first to fourth baseband signals having phases of 0, 0, 90, 90 to the first to fourth baseband units, respectively, and to apply first to LO signals having phases of 0, 0, 90; 90 to the first to fourth up-converters, respectively.

According to an embodiment, in the second non-harmonic rejection mode, the controller may control to apply first to fourth baseband signals having phases of 45, 0, 90, −45 to the first to fourth baseband units, respectively, and to apply first to LO signals having phases of 0, 0, 90, 90 to the first to fourth up-converters, respectively.

According to an embodiment, the plurality of up-converters may output first to fourth RF signals by up-converting the first to fourth baseband signals and the first to fourth LO signals. Also, the mobile terminal may further include: a power amplifier (PA) amplifying a combined signal obtained by combining the output first to fourth RF signals to provide an amplified signal in an RF frequency band. Meanwhile, when it is predicted that a distortion signal in a frequency band adjacent to the RF frequency band due to the amplified signal is equal to or greater than a first threshold value, the controller may control the phases of the first to fourth baseband signals and the first to fourth LO signals such that the harmonic rejection mode is performed.

According to an embodiment, when the distortion signal in the frequency band adjacent to the RF frequency band due to the amplified signal is equal to or lower than a second threshold value and a mode is a low output mode based on the amplified signal value, the controller may control the phases of the first to fourth baseband signals and the first to fourth LO signals such that the first non-harmonic rejection mode for improving the SNR is performed. Here, the second threshold value may be a value lower than the first threshold value.

According to an embodiment, when the distortion signal in the frequency band adjacent to the RF frequency band due to the amplified signal is equal to or lower than a second threshold value and a mode is a high output mode based on the amplified signal value, the controller may control the phase of the first to fourth baseband signals and the first to fourth LO signals such that the second non-harmonic rejection mode for improving linearity is performed.

According to an embodiment, the mobile terminal may further include: a power combiner combining the first to fourth RF signals to output the combined signal; and a power divider distributing the combined signal in a predetermined power distribution ratio. Also, the power amplifier may include first to fourth power amplifiers, and the power divider may provide the combined signal to the first to fourth power amplifiers.

According to an embodiment, when the distortion signal in the frequency band adjacent to the RF frequency band due to the amplified signal is equal to or lower than the second threshold value and the first to fourth power amplifiers are all in an ON state, the controller may determine that a mode is a low output mode based on the output per one power amplifier and control the phases of the first to fourth baseband signals and the first to fourth LO signals such that the first non-harmonic rejection mode for improving the SNR is performed.

According to an embodiment, when the distortion signal in the frequency band adjacent to the RF frequency band due to the amplified signal is equal to or lower than the second threshold value and at least one of the first to fourth power amplifiers is in an OFF state, the controller may determine that a mode is a high output mode based on the output per one power amplifier and control the phases of the first to fourth baseband signals and the first to fourth LO signals such that the second non-harmonic rejection mode for improving linearity is performed.

To achieve these and other advantages and in accordance with the purpose of this specification, as embodied and broadly described herein, a method of controlling harmonics of a mobile terminal includes: a phase determination process of determining phase of a plurality of signals applied to a plurality of baseband units and a plurality of up-converters; a baseband signal output process of outputting baseband signals on the basis of the determined phases; a local oscillator (LO) signal output process of outputting LO signals on the basis of the determined phases; and a radio frequency (RF) signal generation process of generating RF signals using the baseband signals and the LO signals. Here, in the phase determination process, phase values of different types are determined according to a harmonic rejection mode, a first non-harmonic rejection mode for improving a signal-to-noise ratio (SNR), and a second non-harmonic rejection mode for improving linearity.

According to an embodiment, the plurality of baseband units may include first to fourth baseband units, the plurality of up-converters may include first to fourth up-converters. Meanwhile, in the baseband signal output process, in the harmonic rejection mode, first to fourth baseband signals having phases of 45, 0, 90, −45 may be controlled to be applied to the first to fourth baseband units, respectively. Meanwhile, in the LO signal output process, first to fourth LO signals having phases of 45, 0, 90, −45 may be controlled to be applied to the first to fourth up-converters, respectively.

According to an embodiment, in the baseband signal output process, in the first non-harmonic rejection mode, first to fourth baseband signals having phases of 0, 0, 90, 90 may be controlled to be applied to the first to fourth baseband units, respectively. Meanwhile, in the LO signal output process, first to fourth LO signals having phases of 0, 0, 90, 90 may be controlled to be applied to the first to fourth up-converters, respectively.

According to an embodiment, in the baseband signal output process, in the second non-harmonic rejection mode, first to fourth baseband signals having phases of 45, 0, 90, −45 may be controlled to be applied to the first to fourth baseband units, respectively. Meanwhile, in the LO signal output process, first to fourth LO signals having phases of 0, 0, 90, 90 may be controlled to be applied to the first to fourth up-converters, respectively.

According to an embodiment, the method may further include: after the RF signal generation process, a distortion signal determination process for determining whether a distortion signal in a frequency band adjacent to an RF frequency band due to an amplified signal of a power amplifier PA is equal to or greater than a first threshold value may be further included. Meanwhile, if it is determined that the distortion signal is equal to or greater than the first threshold value, a harmonic rejection mode for performing the harmonic rejection mode may be performed. In addition, the method may further include a non-harmonic mode determination process of determining whether the distortion signal is less than or equal to a second threshold value lower than the first threshold value. Also, if the distortion signal is less than or equal to the second threshold value and a mode is a low output mode based on the amplified signal value, the first non-harmonic rejection mode for enhancing the SNR may be performed. Meanwhile, if the distortion signal is equal to or less than the second threshold value and it is determined that the mode is a high power mode based on the amplified signal value, the second non-harmonic rejection mode for enhancing the SNR may be performed.

Meanwhile, a base station according to another aspect of the present invention includes: a plurality of baseband units for generating a baseband (BB) signal; a plurality of up-converters for converting the baseband signals into radio frequency (RF) signals; and a controller for controlling phases of the plurality of baseband signals applied to the plurality of baseband units and the plurality of up-converters. Here, the controller may perform at least one of a harmonic rejection mode, the first non-harmonic rejection mode for improving a signal-to-noise ratio (SNR), and a second non-harmonic rejection mode for improving linearity. Here, the plurality of baseband units may include a first baseband unit to a fourth baseband unit, and the plurality of up-converters may include a first up-converter to a fourth up-converter. Meanwhile, in the harmonic rejection mode, the controller may control to apply the first to fourth baseband signals having phases of 45, 0, 90, and −45, respectively, in the first baseband unit to the fourth baseband unit and apply the first to fourth LO signals having phases of 45, 0, 90, and −45 to the first up-converter to the fourth up-converter, respectively. In addition, in the first non-harmonic rejection mode, the controller may control to apply the first to fourth baseband signals having the phases of 0, 0, 90, 90 to the first to fourth baseband units, respectively, and apply the first to fourth LO signals having phases of 0, 0, 90, 90 to the first to fourth up-converters, respectively. In addition, in the second non-harmonic rejection mode, the controller may control to apply the first to fourth baseband signals having phases of 45, 0, 90, −45 to the first to fourth baseband units, respectively, and to apply the first to fourth LO signals having phases of 0, 0, 90, 90 to the first to fourth up-converters, respectively.

The effects of the mobile terminal and the transmitting part including the baseband unit and the up-converter according to the present invention are as follows.

According to at least one of the embodiments of the present invention, the transmitting part having improved harmonic distortion characteristics and the mobile terminal having the transmitting part may be provided.

In addition, according to at least one of the embodiments of the present invention, the transmitting part having improved SNR characteristics and linearity even in a non-harmonic mode, while improving harmonic characteristics, and the mobile terminal having the transmitting part may be provided.

Further, according to at least one of the embodiments of the present invention, the mobile terminal including the RF front end with improved harmonic characteristics even in the structure including a plurality of power amplifiers may be provided.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

MODES FOR CARRYING OUT THE PREFERRED EMBODIMENTS

Figure 1A:
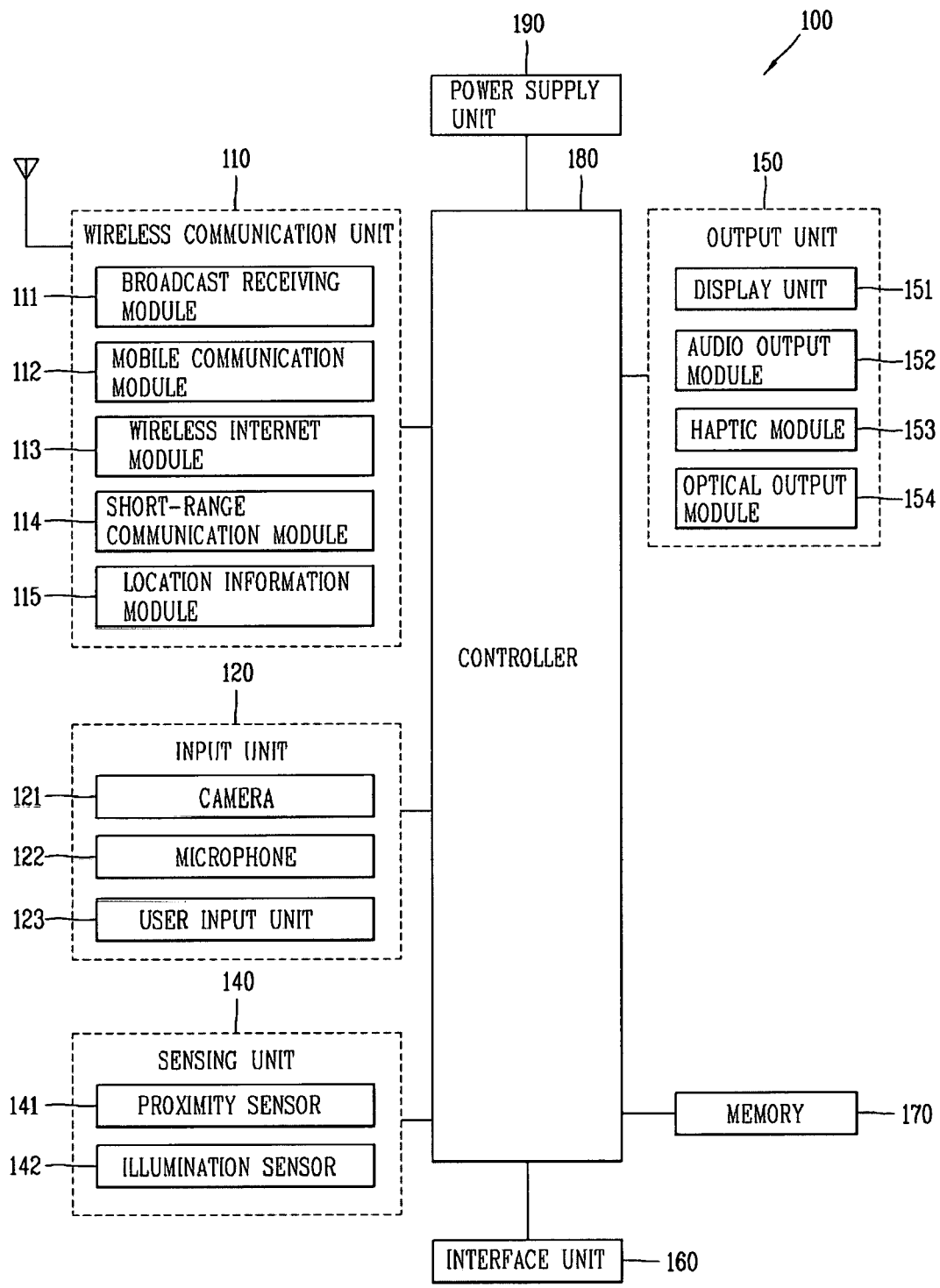
FIG. 1A is a block diagram illustrating a mobile terminal according to the present invention.

Description will now be given in detail of exemplary embodiments, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1B:
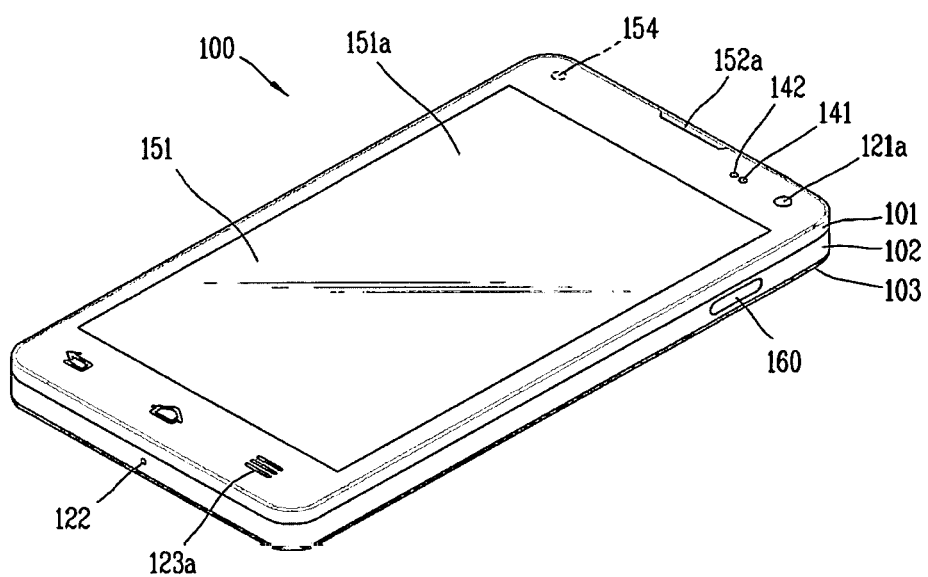
FIGS. 1B and 1C are conceptual diagrams illustrating an example of a mobile terminal according to the present invention viewed in different directions.
Figure 1C:
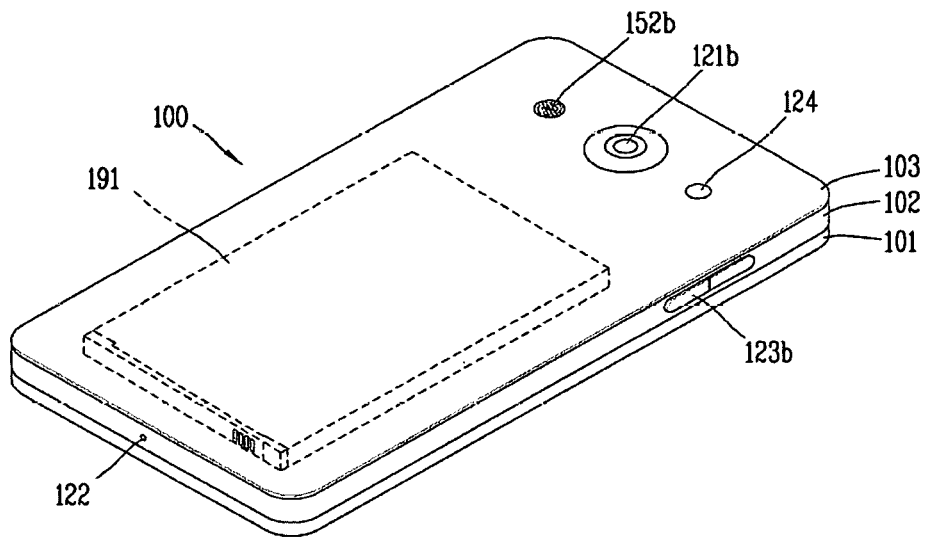

Referring to FIGS. 1A to 1C, FIG. 1A is a block diagram of a mobile terminal in accordance with one exemplary embodiment of the present invention, and FIGS. 1B and 1C are conceptual views illustrating one example of a mobile terminal, viewed from different directions.

The mobile terminal 100 may be shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

In more detail, the wireless communication unit 110 may typically include one or more modules which permit communications such as wireless communications between the mobile terminal 100 and a wireless communication system, communications between the mobile terminal 100 and another mobile terminal, or communications between the mobile terminal 100 and an external server. Further, the wireless communication unit 110 may typically include one or more modules which connect the mobile terminal 100 to one or more networks.

The wireless communication unit 110 may include one or more of a broadcast receiving module 111, a mobile communication module 112, a wireless Internet module 113, a short-range communication module 114, and a location information module 115.

The input unit 120 may include a camera 121 or an image input unit for obtaining images or video, a microphone 122, which is one type of audio input device for inputting an audio signal, and a user input unit 123 (for example, a touch key, a mechanical key, and the like) for allowing a user to input information. Data (for example, audio, video, image, and the like) may be obtained by the input unit 120 and may be analyzed and processed according to user commands.

The sensing unit 140 may typically be implemented using one or more sensors configured to sense internal information of the mobile terminal, the surrounding environment of the mobile terminal, user information, and the like. For example, the sensing unit 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like). The mobile terminal disclosed herein may be configured to utilize information obtained from one or more sensors of the sensing unit 140, and combinations thereof.

The output unit 150 may typically be configured to output various types of information, such as audio, video, tactile output, and the like. The output unit 150 may be shown having at least one of a display unit 151, an audio output module 152, a haptic module 153, and an optical output module 154. The display unit 151 may have an inter-layered structure or an integrated structure with a touch sensor in order to implement a touch screen. The touch screen may function as the user input unit 123 which provides an input interface between the mobile terminal 100 and the user and simultaneously provide an output interface between the mobile terminal 100 and a user.

The interface unit 160 serves as an interface with various types of external devices that are coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). Application programs may be stored in the memory 170, installed in the mobile terminal 100, and executed by the controller 180 to perform an operation (or function) for the mobile terminal 100.

The controller 180 typically functions to control an overall operation of the mobile terminal 100, in addition to the operations associated with the application programs. The controller 180 may provide or process information or functions appropriate for a user by processing signals, data, information and the like, which are input or output by the aforementioned various components, or activating application programs stored in the memory 170.

Also, the controller 180 may control at least some of the components illustrated in FIG. 1A, to execute an application program that have been stored in the memory 170. In addition, the controller 180 may control at least two of those components included in the mobile terminal to activate the application program.

The power supply unit 190 may be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

At least part of the components may cooperatively operate to implement an operation, a control or a control method of a mobile terminal according to various embodiments disclosed herein. Also, the operation, the control or the control method of the mobile terminal may be implemented on the mobile terminal by an activation of at least one application program stored in the memory 170.

Referring to FIGS. 1B and 1C, the disclosed mobile terminal 100 includes a bar-like terminal body. However, the electronic device 100 may alternatively be implemented in any of a variety of different configurations. Examples of such configurations include watch type, clip-type, glasses-type, or a folder-type, flip-type, slide-type, swing-type, and swivel-type in which two and more bodies are combined with each other in a relatively movable manner, and combinations thereof. Discussion herein will often relate to a particular type of mobile terminal. However, such teachings with regard to a particular type of mobile terminal will generally apply to other types of mobile terminals as well.

Here, considering the mobile terminal 100 as at least one assembly, the terminal body may be understood as a conception referring to the assembly.

The mobile terminal 100 will generally include a case (for example, frame, housing, cover, and the like) forming the appearance of the terminal. In this embodiment, the case is formed using a front case 101 and a rear case 102. Various electronic components are interposed into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

The mobile terminal 100 may include a display unit 151, first and second audio output module 152a and 152b, a proximity sensor 141, an illumination sensor 142, an optical output module 154, first and second cameras 121a and 121b, first and second manipulation units 123a and 123b, a microphone 122, an interface unit 160, and the like.

Hereinafter, as illustrated in FIGS. 1B and 1C, description will be given of the exemplary mobile terminal 100 in which the front surface of the terminal body is shown having the display unit 151, the first audio output module 152a, the proximity sensor 141, the illumination sensor 142, the optical output module 154, the first camera 121a, and the first manipulation unit 123a, the side surface of the terminal body is shown having the second manipulation unit 123b, the microphone 122, and the interface unit 160, and the rear surface of the terminal body is shown having the second audio output module 152b and the second camera 121b.

However, those components may not be limited to the arrangement. Some components may be omitted or rearranged or located on different surfaces. For example, the first manipulation unit 123a may not be located on the front surface of the terminal body, and the second audio output module 152b may be located on the side surface of the terminal body other than the rear surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display module 151 may include at least one of a liquid crystal display (LCD), a thin film transistor-LCD (TFT LCD), an organic light-emitting diode (OLED), a flexible display, a three-dimensional (3D) display and an e-ink display.

The display unit 151 may be implemented using two display devices, according to the configuration type thereof. For instance, a plurality of the display units 151 may be arranged on one side, either spaced apart from each other, or these devices may be integrated, or these devices may be arranged on different surfaces.

The display unit 151 may include a touch sensor that senses a touch with respect to the display unit 151 so as to receive a control command in a touch manner. Accordingly, when a touch is applied to the display unit 151, the touch sensor may sense the touch, and a controller 180 may generate a control command corresponding to the touch. Contents input in the touch manner may be characters, numbers, instructions in various modes, or a menu item that can be specified.

The first audio output module 152a may be implemented as a receiver for transmitting a call sound to a user's ear and the second audio output module 152b may be implemented as a loud speaker for outputting various alarm sounds or multimedia playback sounds.

The window 151a of the display unit 151 may include sound holes for emitting sounds generated from the first audio output module 152a. However, the present invention is not limited thereto, and the sounds may be released along an assembly gap between the structural bodies (for example, a gap between the window 151a and the front case 101). In this case, a hole independently formed to output audio sounds may not be seen or may otherwise be hidden in terms of appearance, thereby further simplifying the appearance of the mobile terminal 100.

The optical output module 154 may be configured to output light for indicating an event generation. Examples of such events may include a message reception, a call signal reception, a missed call, an alarm, a schedule alarm, an email reception, information reception through an application, and the like. When a user has checked a generated event, the controller 180 may control the optical output module 154 to stop the light output.

The first camera 121a may process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion. The first and second manipulation units 123a and 123b may employ any method if it is a tactile manner allowing the user to perform manipulation with a tactile feeling such as touch, push, scroll or the like The first and second manipulation units 123a and 123b may also be manipulated through a proximity touch, a hovering touch, and the like, without a user's tactile feeling.

The drawings are illustrated on the basis that the first manipulation unit 123a is a touch key, but the present invention may not be necessarily limited to this. For example, the first manipulation unit 123a may be configured as a mechanical key, or a combination of a touch key and a push key.

The content received by the first and second manipulation units 123a and 123b may be set in various ways. For example, the first manipulation unit 123a may be used by the user to input a command such as menu, home key, cancel, search, or the like, and the second manipulation unit 123b may be used by the user to input a command, such as controlling a volume level being output from the first or second audio output module 152a or 152b, switching into a touch recognition mode of the display unit 151, or the like.

Hereinafter, embodiments related to a transmitting part for performing harmonic rejection and a mobile terminal having the same according to the present invention will be described with reference to the accompanying drawings. It will be apparent to those skilled in the art that the present invention may be embodied in other specific forms without departing from the spirit or essential characteristics thereof.

Figure 2:
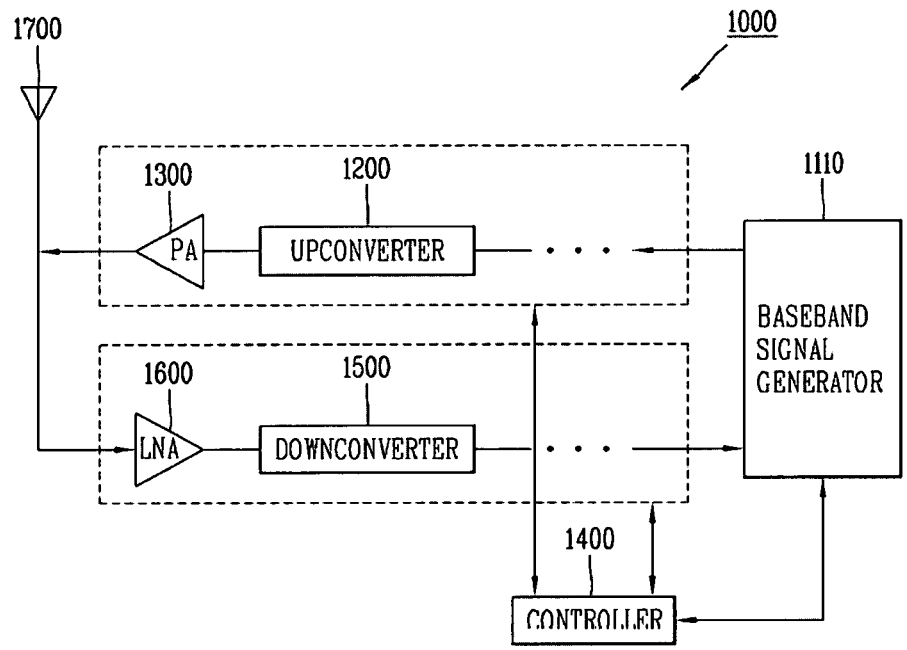
FIG. 2 illustrates a mobile terminal having an up-converter according to the present invention.

FIG. 2 illustrates a transmitting part for performing harmonic rejection according to the present invention and a mobile terminal having the same. Meanwhile, elements to be described in FIG. 2 may be included in the wireless communication unit 110 of FIG. 1A, and in particular, the wireless communication unit 110 may be included in the broadcast receiving module 111, the mobile communication module 112, and the like, but the present invention is not limited thereto.

Referring to FIG. 2, a mobile terminal 1000 includes a baseband unit 1100, an up-converter 1200, a power amplifier (PA) 1300, and a controller 1400. In addition, the mobile terminal may further include a down-converter 1500, a low noise amplifier (LNA) 1600, and an antenna 1700. Here, the up-converter 1200 and the power amplifier 1300 correspond to a transmitting part, and the down-converter 1500 and the LNA 1600 correspond to a receiving part. In the present invention, the up-converter 1200 corresponding to the transmitting part will be mainly described, but the down-converter 1500 corresponding to the receiving part may also be configured to correspond to the up-converter.

As described above, the up-converter 1200 and the power amplifier 1300 according to the present invention may correspond to the wireless communication unit 110 of FIG. 1A. Accordingly, the wireless communication unit 110 may include the up-converter 1200 and the power amplifier 1300, which are one or more modules that enable wireless communication. Thus, wireless communication may be performed between the mobile terminal 1000 and a wireless communication system, between the mobile terminal 1000 and another mobile terminal, or between the mobile terminal 1000 and an external server, via the up-converter 1200 and the power amplifier 1300.

Specifically, the baseband unit 1100 is configured to generate a baseband (BB) signal and provide the generated baseband signal to the transmitting part or the receiving part. Meanwhile, the up-converter 1200 is configured to convert the baseband (BB) signal to a radio frequency (RF) signal. At this time, the baseband unit 1100 and the up-converter 1200 may be configured with a plurality of baseband units and a plurality of up-converters to perform harmonic rejection.

Meanwhile, the up-converter 1200 up-converts the baseband signal to an RF signal of an RF band through a local oscillator. The power amplifier 1300 is connected to the up-converter 1200, amplifies the RF signal from the up-converter 1200, and provides the amplified RF signal to the antenna 1500. The controller 1400 is configured to control a phase of a plurality of signals applied to the plurality of baseband units and the plurality of up-converters to control a harmonic rejection operation of the mobile terminal 1000.

On the other hand, the LNA 1600 is configured to low-noise amplify the RF signal received from the antenna 1500. In addition, the down-converter 1500 is coupled to the LNA 1600 and is configured to convert the low-noise amplified RF signal to a baseband signal. In other words, the down-converter 1500 down-converts the low-noise amplified RF signal to the baseband signal through a local oscillator.

Hereinafter, a method of controlling harmonic characteristics of the transmitting part according to the present invention will be described in detail. In this connection, FIG. 3 illustrates a structure of the transmitting part for controlling the harmonic characteristics according to the present invention.

Figure 3:
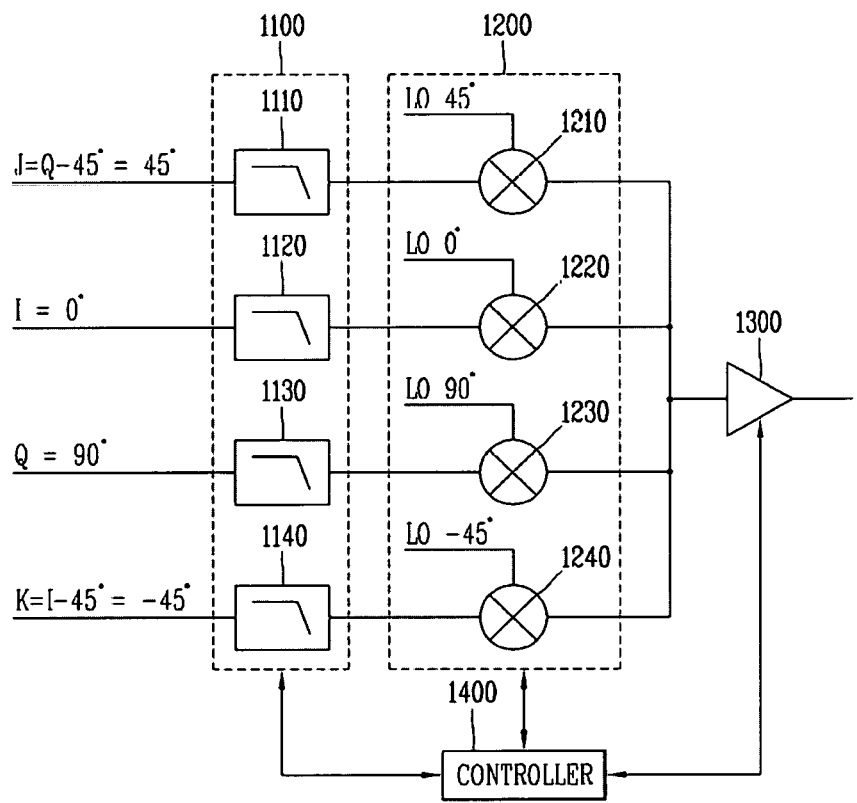
FIG. 3 illustrates a structure of a transmitting part for controlling harmonic characteristics according to the present invention.

Meanwhile, referring to FIG. 3, the transmitting part includes a plurality of baseband units 1100, a plurality of up-converters 1200, a power amplifier 1300, and a controller 1400. As described above, the plurality of baseband units 1100 generate a baseband (BB) signal. In addition, a plurality of up-converters 1200 convert the baseband signal to a radio frequency (RF) signal.

Meanwhile, in the present invention, a set of repeated blocks are required for realizing a harmonic cancellation function of the transmitting part. In the harmonic cancelation mode (or harmonic rejection mode), these blocks are operated using properly phase-shifted signals as compared to a main transmitting part path. However, in a non-harmonic cancellation mode (or non-harmonic rejection mode), not every block should be used. However, there is a need to add a new operation mode that enables harmonic rejection blocks to operate with the same signals as those of the main transmitting part block. To this end, a circuitry that allows the selection of correctly phased signals for the existing Tx path is required to be implemented. The advantage of this configuration is that a signal-to-noise ratio (SNR) of the entire transmitting part increases because signals are correlated although noise generated by the parallel type transmitting parts are not correlated.

To this end, the plurality of baseband units 1100 include first to fourth baseband units (or baseband signal generators) 1110 to 1140, and the plurality of up-converter units 1200 include first to fourth up-converters 1210 to 1240.

Here, the number of the plurality of baseband units 1100 and the plurality of up-converters 1200 is not limited thereto, but may be variously changed according to applications. For example, the number of the plurality of baseband units 1100 and the plurality of up-converters 1200 may be expanded to, six, eight, and so on, as well as to four. In addition, the number of baseband units 1100 may be one, and the baseband units 1100 may be distributed to a plurality of signal paths and a phase value may be variously changed in every signal path to generate four, six, and eight LO signals. Meanwhile, the plurality of baseband units 1110 and the plurality of up-converts 1200 may be combined to be different in number.

Meanwhile, the plurality of up-converters 1210 to 1240 output the first RF signal to the fourth RF signal by up-converting the first to fourth baseband signals and first to fourth LO signals.

The power amplifier 1300 amplifies a signal obtained by combining output first to fourth RF signals to provide an amplified signal in an RF frequency band.

At this time, the controller 1400 may perform at least one of a harmonic rejection mode, a first non-harmonic rejection mode for improving a signal-to-noise ratio (SNR) mode, and a second non-harmonic rejection mode for improving linearity. Specifically, in FIG. 3, the controller 1400 performs the harmonic rejection mode.

Specifically, in the harmonic rejection mode of FIG. 3, the controller 1400 may perform the following operations. In the harmonic rejection mode, the controller 1400 may control to apply first to fourth baseband signals having a first phase combination of a specific type to the first to fourth baseband units 1110 to 1140. Here, the first phase combination may be 45, 0, 90, and −45, but is not limited thereto. In addition, the controller 1400 controls to apply first to fourth LO signals having a first phase combination of a specific type to the first to fourth up-converters 1210 to 1240 in the harmonic rejection mode. Here, the first phase combination may be 45, 0, 90, and −45, but is not limited thereto.

Figure 4:
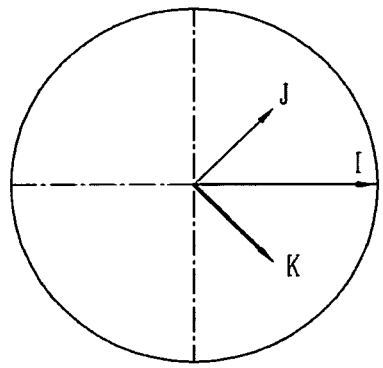
FIG. 4 illustrates a magnitude and a phase of a signal for each frequency band and for each channel in a harmonic rejection mode according to the present invention.
Figure 4:
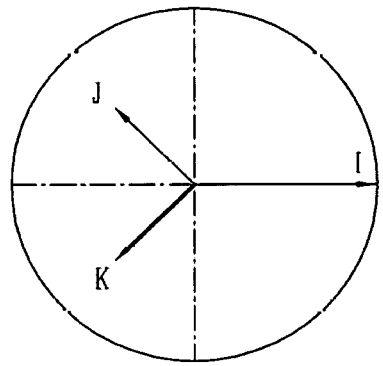
Figure 4:
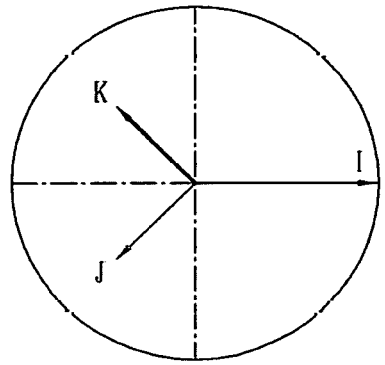

In this regard, FIG. 4 illustrates magnitudes and phases of a signal for each frequency band and each channel in the harmonic rejection mode according to the present invention. Referring to FIGS. 3 and 4, the second baseband unit 1120 and the third baseband unit 1130 may be represented by I and Q channels, respectively. In addition, the first baseband unit 1110 and the fourth baseband unit 1140 may be represented by J and K channels, respectively. At this time, baseband signals are correlated with respect to an I/Q modulation signal of an I/Q modulator and a J/K modulation signal of a J/K modulator. That is, I2+Q2=1 is satisfied and J2+K2=1 is satisfied. Also, a J+K vector has a phase difference of 90°, compared to an I+Q vector. Meanwhile, since the baseband signals are multiplied by LO signals by respective mixers, if the I channel has a maximum value at a specific instant, the Q channel has a minimum value, i.e., 0, and accordingly, an associated RF component also has a value of 0. Thus, an output at the LO frequency at the instant of I=1 may be I=1, J2=½, and K2=½, and phase values in the J and K channels may be 45 and −45, respectively. Thus, a combined signal for the four channels at the LO frequency has a magnitude of 2 and a phase value of 0.

Meanwhile, an output at a 3LO frequency may be I=1, J2=½, K2=½, and phase values in the J and K channels may be 135 and −135, respectively. Thus, a combined signal for the four channels at the 3LO frequency has a magnitude of 0, and accordingly, a harmonic distortion signal may be canceled out. Similarly, an output at a 5LO frequency may be I=1, J2=½, K2=½, and phase values in the J and K channels may be 225 and −225, respectively. Thus, a combined signal for the four channels at the 5LO frequency has a magnitude of 0, and accordingly, a harmonic distortion signal may be canceled out.

As described above, the J/K signal having the additional LO phase, i.e., a specific phase value is generated with divide by four circuits, a VCO frequency that is four times higher is required as the LO, thus increasing current consumption.

Figure 5:
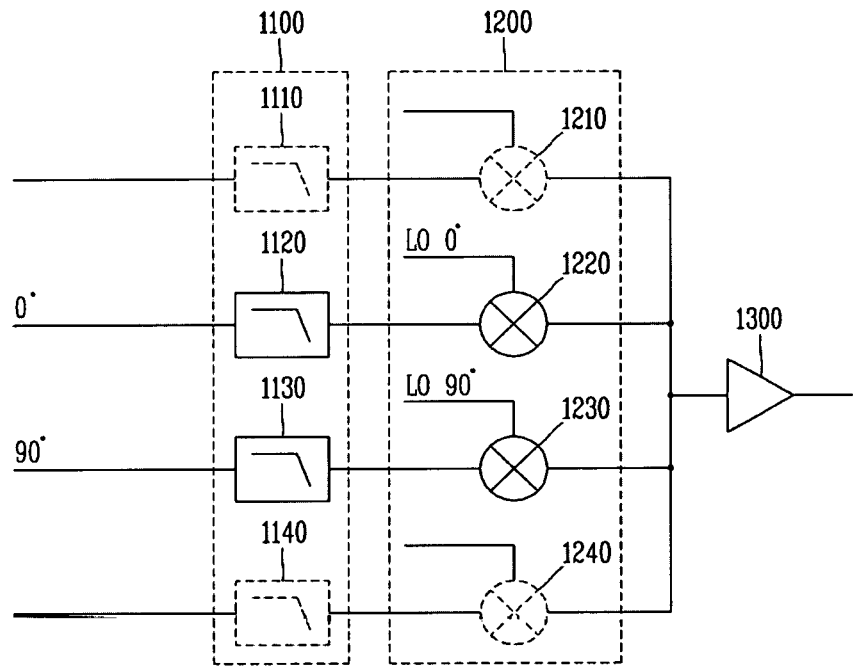
FIG. 5 illustrates an operation of a transmitting part in a non-harmonic rejection mode according to the present invention.

Meanwhile, FIG. 5 illustrates an operation of the transmitting part in the non-harmonic rejection mode according to the present invention. At this time, as illustrated in FIG. 5, only the I/Q channel may be used in the non-harmonic rejection mode.

Referring to FIGS. 2 and 5, the controller 1400 may control to apply phase values of a corresponding channel in the first phase combination to each of the second baseband unit 1120 and the third baseband unit 1130. In this case, the phase values of the corresponding channel in the first phase combination may be 0° and 90°, respectively, but are not limited thereto. Meanwhile, a signal is not applied to the first baseband unit 1110 and the fourth baseband unit 1140.

Meanwhile, the controller 1400 may control to apply phase values of the corresponding channel in the first phase combination to the second up-converter 1220 and the third up-converter 1230, respectively. In this case, the phase values of the corresponding channel in the first phase combination may be 0° and 90°, respectively, but are not limited thereto. Meanwhile, a signal is not applied to the first up-converter 1210 and the fourth up-converter 1240.

Referring to FIGS. 2 to 4, additional signal routing options according to the present invention may be used, i.e., additional signal routing for four or more channels rather than two channels may be used. In this regard, for the additional signal routing options, a harmonic rejection scheme is required to be added. Accordingly, the same signal as the main transmission path may be transmitted, and an optimal phase combination for harmonic rejection may be used. Meanwhile, this structure may be activated in another mode (state). That is, if the SNR is critical and the harmonic rejection function is not used, these configuration blocks may be reconfigured in other ways.

Meanwhile, the above-described non-harmonic rejection mode may be configured as a first non-harmonic rejection mode for improving the signal-to-noise ratio (SNR) or a second non-harmonic rejection mode for improving linearity.

Figure 6:
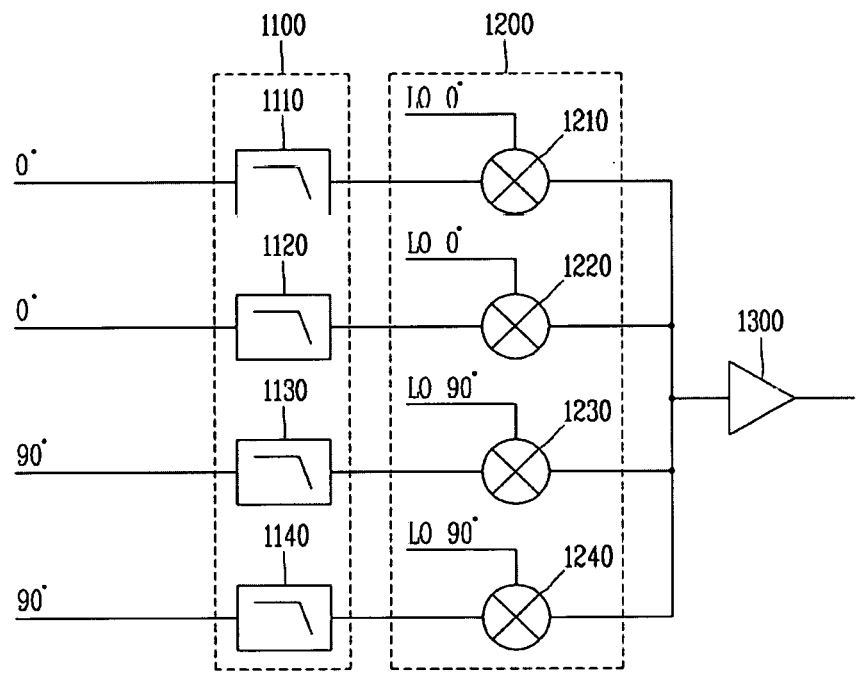
FIG. 6 illustrates an operation of a transmitting part in a first non-harmonic rejection mode for improving SNR according to the present invention.

FIG. 6 illustrates an operation of the transmitting part in the first non-harmonic rejection mode for improving an SNR according to the present invention. At this time, as shown in FIG. 6, in the first non-harmonic rejection mode, the same phase may be applied to an I channel and a J channel, and the same phase may be applied to a Q channel and a K channel.

Referring to FIGS. 2 and 6, the controller 1400 may control to apply first to fourth baseband signals having a second phase combination of a specific type to the first to fourth baseband units 1110 to 1140 in the first non-harmonic rejection mode. At this time, the second phase combination may be U, U, 9U, 90, respectively, but is not limited thereto.

Meanwhile, the controller 1400 may control to apply the first to fourth LO signals having a second phase combination of a specific type to the first to fourth LO converters 1210 to 1240. At this time, the second phase combination may be 0, 0, 90, 90, respectively, but is not limited thereto.

Figure 7:
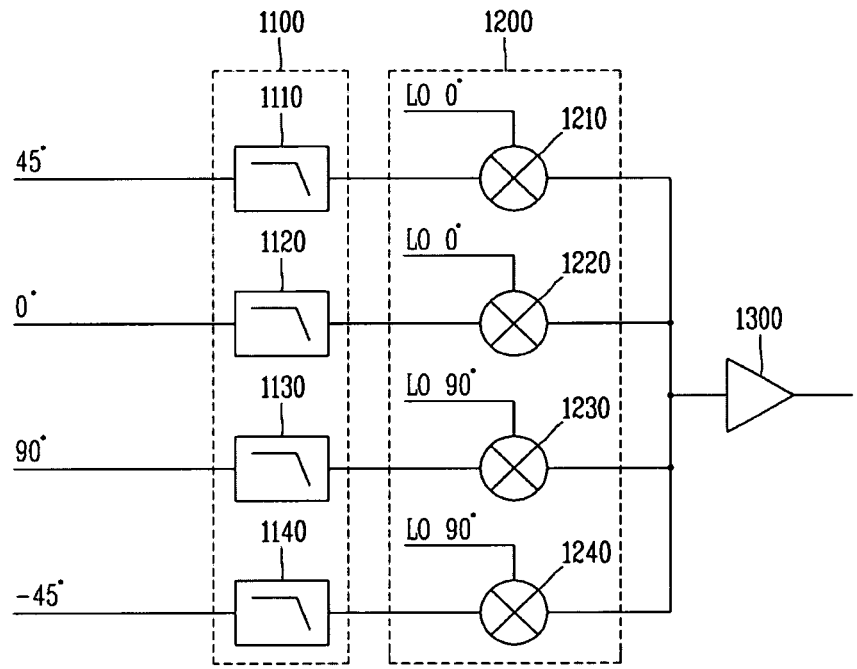
FIG. 7 illustrates an operation of a transmitting part in a second non-harmonic rejection mode for improving linearity according to the present invention.

FIG. 7 illustrates an operation of the transmitting part in the second non-harmonic rejection mode for improving linearity according to the present invention.

In this regard, considerable improvement may be made using transmitting parts designed for harmonic rejection, even though phase values different to the I/Q channel are applied to the J/K channel.

Since four filters (BB filters) are used before the plurality of up-converters 1200, a noise level is reduced. That is, since the four filters mean four independent noise contributors, the noise level is reduced. Therefore, it can be seen that noise contribution by the four filters before the plurality of up-converters 1200 is reduced by 3 dB compared with the case where only the I/Q channel is used. Meanwhile, different phase values are used for the I/Q channel and J/K channel for all four paths before the plurality of up-converters 1200, but linearity is improved for the LO even in otherwise case. That is, in the second non-harmonic rejection mode for improving the linearity of FIG. 7, linearity of the transmitting part increases as compared with the case where only the I/Q channel of FIG. 5 is used. As the linearity is improved as described above, there is only a slight decrease in the output power even in a high output mode in which the output power is large.

In this regard, referring to FIGS. 2 and 7, the controller 1400 may control to apply first to fourth baseband signals having a first phase combination of a specific type to the first to fourth baseband units 1110 to 1140 in the second non-harmonic rejection mode. In this case, the first phase combination may be 45, 0, 90, and −45, respectively, but is not limited thereto.

Meanwhile, the controller 1400 may control to apply first to fourth LO signals having a second phase combination of a specific type to the first to fourth LO converters 1210 to 1240. At this time, the second phase combination may be 0, 0, 90, 90, respectively, but is not limited thereto. That is, in the second non-harmonic rejection mode, the first phase combination, which is the phase combination in the harmonic rejection mode, is used in the baseband unit. However, in the second non-harmonic rejection mode, the second phase combination as the phase combination in the (first) non-harmonic rejection mode is used in the up-converter.

A specific algorithm for performing the above-described harmonic rejection mode and the first and second non-harmonic rejection modes will be described below. In this regard, the case where the harmonic rejection mode is started will be described first.

Referring to FIG. 2, the controller 1400 predicts whether a distortion signal is equal to or greater than a first threshold value in a frequency band adjacent to an RF frequency band due to an amplified signal output from the power amplifier 1300. Here, the meaning of "predicting whether the distortion signal is equal to or greater than the first threshold value" includes a meaning of predicting the distortion signal before the distortion signal is expected to be equal to or greater than the first threshold value. Or, it includes a case where the distortion signal is already generated to exceed the first threshold value.

If the distortion signal is predicted to be equal to or greater than the first threshold value, the controller 1400 may control phases of the first to fourth baseband signals and the first to fourth LO signals so that the harmonic rejection mode is performed.

Meanwhile, transition from the harmonic rejection mode to the first non-harmonic rejection mode will be described below. At this time, the controller 1400 determines whether the distortion signal in the frequency band adjacent to the RF frequency band due to the amplified signal is lower than a second threshold value and the distortion signal is in the low power mode based on the amplified signal value. Here, the second threshold value may be a value lower than the first threshold value. It is desirable to improve the SNR when harmonic distortion does not occur and the output value of the power amplifier 1300 is low. Accordingly, the controller. 1400 may perform phase control in a manner of improving the SNR as follows.

Accordingly, when the distortion signal is lower than or equal to the second threshold value and it is determined that the distortion signal is in the low power mode, the controller 1400 may perform the first non-harmonic rejection mode for improving the SNR. That is, when it is determined that the distortion signal is equal to or lower than the second threshold value and is in the low power mode, the controller 1400 may change the phases of the first to fourth baseband signals and the first to fourth LO signals from the first phase combination to the second phase combination. In this case, the first and second phase combinations are 45, 0, 90, −45 and 0, 0, 90, and 90 as described above, but are not limited thereto.

Meanwhile, transition from the harmonic rejection mode to the second non-harmonic rejection mode will be described below. At this time, the controller 1400 determines whether the distortion signal in the frequency band adjacent to the RF frequency band due to the amplified signal is equal to or lower than the second threshold value and is in a high power mode based on the amplified signal value. Here, the second threshold value may be a value lower than the first threshold value. It is more preferable to improve linearity of the transmitting part than to improve the SNR if an output value of the power amplifier 1300 is high although harmonic distortion does not occur. Accordingly, the controller 1400 may perform phase control in a manner of improving the linearity of the transmitting part as follows.

Accordingly, the controller 1400 may perform the second non-harmonic rejection mode for improving linearity of the output signal if the distortion signal is less than or equal to the second threshold and is in the low power mode. That is, if the distortion signal is less than the second threshold and it is determined that the mode is the high power mode, the controller 1400 may perform the second non-harmonic rejection mode for improving linearity. That is, when it is determined that the distortion signal is equal to or less than the second threshold value and is in the high power mode, the controller 1400 may control phases of the first to fourth baseband signals and the phases of the first to fourth LO signals as follows. That is, the phases of the first to fourth baseband signals may maintain the first phase combination, and the phases of the first to fourth LO signals may change from the first phase combination to the second phase combination. In this case, the first and second phase combinations are 45, 0, 90, −45 and 0, 0, 90, and 90 as described above, but are not limited thereto. Meanwhile, the second non-harmonic rejection mode is useful if linearity improvement is required, but the normal harmonic rejection mode can't be used, i.e. div/4 LO generation can't be used due to VCO max frequency limitation. In this regard, if the div/4 LO generation can be used, the normal harmonic rejection mode is the preferred implementation to improve linearity.

Figure 8:
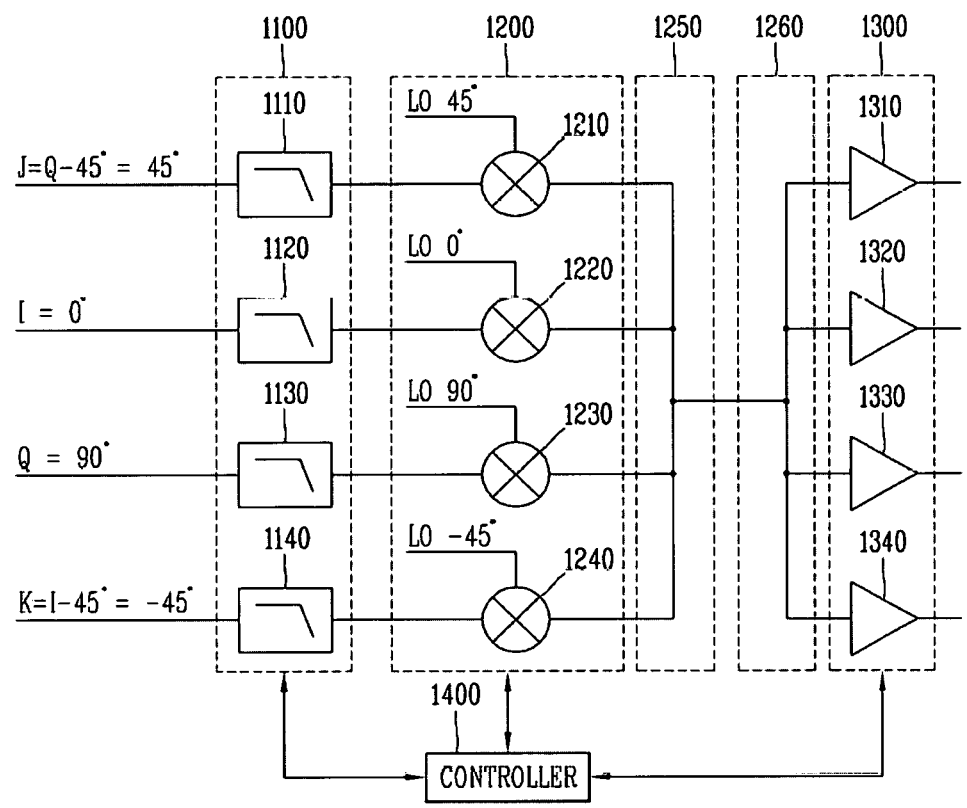
FIG. 8 illustrates a transmitting part having a plurality of power amplifiers according to an embodiment of the present invention.

Meanwhile, the power amplifier 1300 of FIG. 2 may be provided in the form of a plurality of power amplifiers (PAs). In this regard, FIG. 8 illustrates a transmitting part having a plurality of PAs according to an embodiment of the present invention. The transmitting part having the plurality of PAs has the following advantages. That is, even if an output power value output per one power amplifier is low, a high output power value may be obtained by combining the output powers of the plurality of PAs. Meanwhile, in a communication service such as 5G communication service which is performed in a higher frequency band than the 4G communication service, there is a tendency to have a plurality of power amplifiers and a plurality of antennas rather than one power amplifier. Referring to FIG. 8, the power amplifier 1300 includes first to fourth power amplifiers 1310 to 1340. In this case, a power combiner 1250 and a power divider 1260 may be further provided between the plurality of up-converters 1200 and the plurality of power amplifiers 1300.

The power combiner 1250 may be configured to combine first to fourth RF signals to output a combined signal. The harmonic rejection/SNR improvement/linearity improvement may be achieved by the signal combined by the power combiner 1250 that combines the baseband signal whose phase is adjusted (controlled) according to the mode and the RF signal generated from the LO signal.

Meanwhile, the power divider 1260 is configured to distribute the combined signal in a certain power distribution ratio. That is, the power divider 1260 provides the combined signal in which harmonic rejection/SNR enhancement/linearity enhancement are achieved too the respective first to fourth power amplifiers 1310 to 1340 according to the mode.

Meanwhile, when the plurality of power amplifiers, that is, the first to fourth power amplifiers 1310 to 1340, are provided, the mode may be determined by a method other than the magnitude of the distortion signal and the magnitude of the amplified signal. That is, when a plurality of power amplifiers are provided, the mode may be determined according to the number of power amplifiers in an ON state.

For example, if the distortion signal is below the second threshold in a frequency band adjacent to the RF frequency band due to the amplified signal and the first to fourth power amplifiers 1310 to 1340 are all in the ON state, the controller 1400 may perform the first non-harmonic rejection mode. In this case, if the first to fourth power amplifiers 1310 to 1340 are all in the ON state, the output per one power amplifier is in a low output state, so that it is determined as a low output mode and the first non-harmonic rejection mode may be performed to enhance the SNR.

Therefore, when the distortion signal is below the second threshold and the first to fourth power amplifiers 1310 to 1340 are all in the ON state, the controller 1400 may control the phase of the first to fourth baseband signals and the phases of the first to fourth LO signals so that the first non-harmonic rejection mode may be performed. At this time, the phase combination of the baseband signals and the LO signals may be all the second phase combination as described above. For example, the second phase combination may be 0, 0, 90, 90, but is not limited thereto.

Meanwhile, the controller 1400 may determine that the mode is the high power mode when the distortion signal is below the second threshold and at least one of the first to fourth power amplifiers 1310 to 1340 is in an OFF state. Accordingly, the controller 1400 may control the phases of the first to fourth baseband signals and the first to fourth LO signals so that the second non-harmonic rejection mode for improving linearity is performed. At this time, the phase combination of the baseband signals and the LO signals may be the first phase combination and the second phase combination, respectively, as described above. For example, the first phase combination may be 45, 0, 90, −45, and the second phase combination may be 0, 0, 90, 90, but is not limited thereto.

Figure 9:
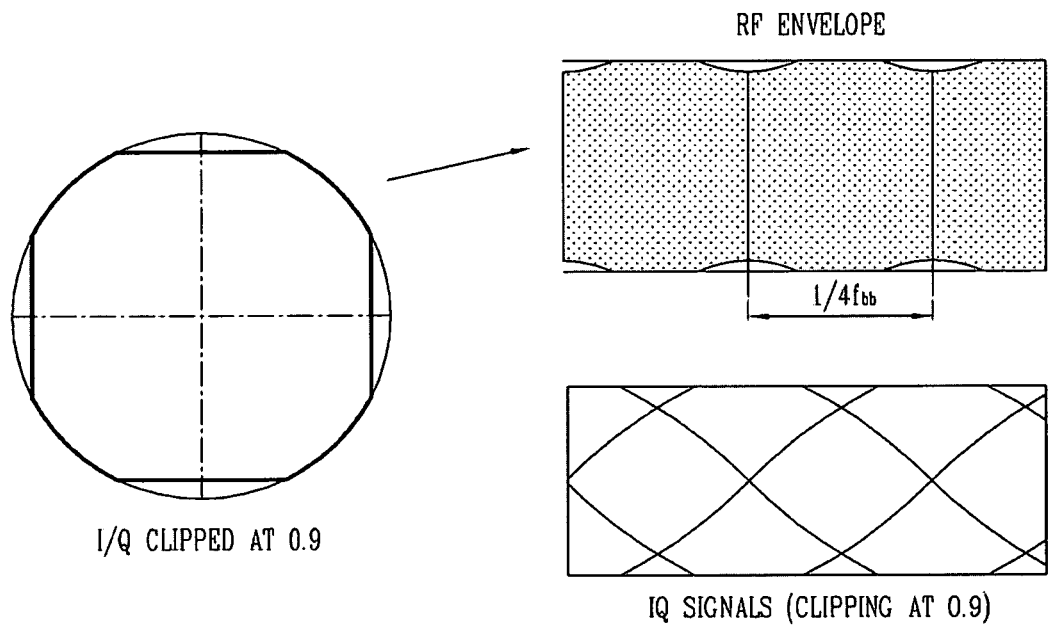
FIG. 9 illustrates an envelope of an RF signal according to I/Q clipping in a non-harmonic mode according to the present invention.
Figure 10:
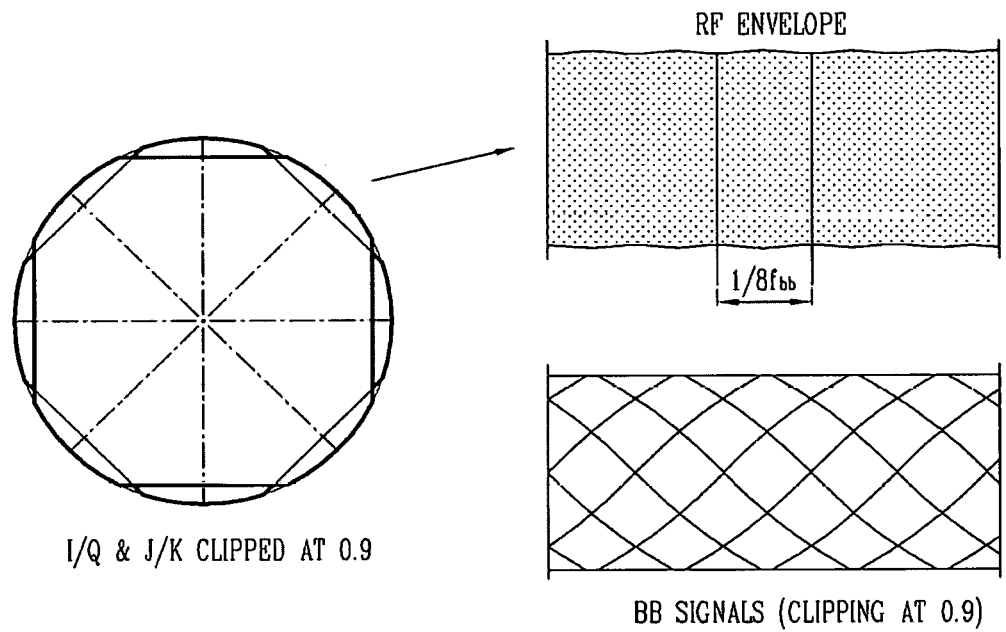
FIG. 10 illustrates an envelope of an RF signal according to I/Q clipping in a non-harmonic mode for linearity improvement according to the present invention.

Meanwhile, a difference in characteristics between the mode for improving the linearity according to the present invention and a different mode will be described as follows. In this regard, FIGS. 9 and 10 show the envelope of the RF signal according to clipping of an I/Q signal according to the present invention. In this regard, it is possible to improve linearity through a combination of phases of the baseband signals and the LO signals which produce different combinations of vectors than in the other modes. In this regard, when clipping is applied to the baseband signals, the characteristics shown in FIGS. 9 and 10 may be obtained when mixed with the LO signals.

FIG. 9 illustrates an envelope of an RF signal according to I/Q clipping in the non-harmonic mode according to the present invention. It is assumed that, in the non-harmonic mode, only the I/Q signal is applied, the J/K signal is not applied and may be referred to as a normal mode. As shown in FIG. 9, it can be seen that an AM (Amplitude Modulation) component having a specific period in the RF frequency band is included. Here, the specific period may be ¼ fbb, and here, a magnitude of the AM component is determined according to the amount of compression/clipping.

FIG. 10 illustrates an envelope of an RF signal according to I/Q clipping in the non-harmonic mode for improving linearity according to the present invention. In this case, the non-harmonic mode for improving linearity may be the second non-harmonic mode. In the second non-harmonic mode for improving linearity, it is assumed that both the I/Q signal and the J/K signal are applied. As shown in FIG. 10, it can be seen that an AM (Amplitude Modulation) component having a specific period in the RF frequency band is included. At this time, the specific period may be ⅛ fbb, and as the J/K signal is added, the specific period decreases compared with the general period.

As shown in FIG. 10, when BB clipping having the same size as that of FIG. 9 is applied to a linearity enhancement mode, due to the J/K signal as an additional signal and their baseband phases, the AM component has a smaller amplitude fluctuation in a high frequency than in the normal mode. Therefore, in the linearity enhancement mode, linearity is improved with smaller amplitude fluctuation than in the normal mode, which may contribute to improvement of communication performance in the high output mode.

In the above, the transmitting part for performing the harmonic rejection/non-harmonic rejection mode according to the present invention and the mobile terminal including the transmitting part have been described. Meanwhile, such a transmitting part performing the harmonic rejection/non-harmonic rejection mode may also be provided in a base station. Therefore, the above-described contents and configuration may also be applied to a base station. In this regard, a base station according to another aspect of the present invention includes: a plurality of baseband units for generating a baseband (BB) signal; a plurality of up-converters for converting the baseband signals into radio frequency (RF) signals; and a controller for controlling phases of the plurality of baseband signals applied to the plurality of baseband units and the plurality of up-converters. Here, the controller may perform at least one of a harmonic rejection mode, the first non-harmonic rejection mode for improving a signal-to-noise ratio (SNR), and a second non-harmonic rejection mode for improving linearity. Here, the plurality of baseband units may include a first baseband unit to a fourth baseband unit, and the plurality of up-converters may include a first up-converter to a fourth up-converter. Meanwhile, in the harmonic rejection mode, the controller may control to apply the first to fourth baseband signals having phases of 45, 0, 90, and −45, respectively, in the first baseband unit to the fourth baseband unit and apply the first to fourth LO signals having phases of 45, 0, 90, and −45 to the first up-converter to the fourth up-converter, respectively. In addition, in the first non-harmonic rejection mode, the controller may control to apply the first to fourth baseband signals having the phases of 0, 0, 90, 90 to the first to fourth baseband units, respectively, and apply the first to fourth LO signals having phases of 0, 0, 90, 90 to the first to fourth up-converters, respectively. In addition, in the second non-harmonic rejection mode, the controller may control to apply the first to fourth baseband signals having phases of 45, 0, 90, −45 to the first to fourth baseband units, respectively, and apply the first to fourth LO signals having phases of 0, 0, 90, 90 to the first to fourth up-converters, respectively.

A method of performing harmonic control described above will be described as follows. In this regard, the method of performing the harmonic rejection/non-harmonic rejection mode may be performed by a controller (or processor). Meanwhile, the contents described in the transmitting part performing the harmonic rejection/non-harmonic rejection mode and the mobile terminal having the transmitting part may be combined and used by mutual reference.

Figure 11:
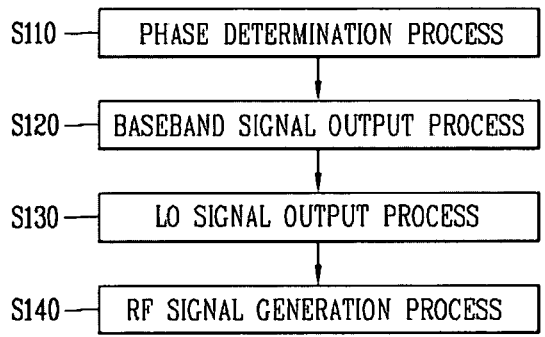
FIG. 11 is a flowchart of a method of controlling harmonics according to the present invention.

In this regard, FIG. 11 illustrates a flowchart of a harmonic control method according to the present invention. Referring to FIG. 11, the harmonic control method may be performed by the controller 1400. At this time, the controller 1400 corresponds to a processor or a modem, and the corresponding operations may be performed by a communication processor (CP) or an application processor (AP). Meanwhile, the harmonic control method includes a phase determination process S110, a baseband signal output process S120, an LO signal output process S130, and an RF signal generation process S140.

In the phase determination process (S110), phases of a plurality of signals applied to the plurality of baseband units and the plurality of up-converters are determined.

In the baseband signal output process (S120), baseband (BB) signals are output based on the determined phases.

In the LO signal output process (S130), local oscillator (LO) signals are output based on the determined phases.

In the RF signal generation process (S140), RF signals are generated using the baseband signals and the LO signals.

Meanwhile, in the phase determination process S110, phase values of different types may be determined according to the harmonic rejection mode, the first non-harmonic rejection mode for improving a signal-to-noise ratio (SNR), and the second non-harmonic rejection mode for improving the linearity.

Accordingly, the baseband signal output process (S120) and the LO signal output process (S130) will be described based on the phase values determined through the phase determination process (S110) in each mode.

First, in the harmonic rejection mode, the baseband signal output process (S120) and the LO signal output process (S130) are as follows.

In the baseband signal output process S120, first to fourth baseband signal having phases of 45, 0, 90, −45 are controlled to be applied to the first baseband signal to the fourth baseband signal in the harmonic rejection mode, respectively.

In the LO signal output process S130, first to fourth LO signals having phases of 45, 0, 90, −45 are controlled to be applied to the first to fourth up-converters.

Next, the baseband signal output process (S120) and the LO signal output process (S130) in the first non-harmonic rejection mode for improving the SNR are as follows.

In the baseband signal output process S120, in the first non-harmonic rejection mode, first to fourth baseband signals having phases of 0, 0, 90 and 90 are controlled to be applied to the first to fourth baseband units, respectively.

In the LO signal output process (S130), in the first non-harmonic rejection mode, first to fourth baseband signals having phases of 0, 0, 90 and 90 are controlled to be applied to the first to fourth baseband units, respectively.

Next, the baseband signal output process (S120) and the LO signal output process (S130) in the second non-harmonic rejection mode for improving linearity are as follows.

In the baseband signal output process (S120), in the second non-harmonic rejection mode, first to fourth baseband signals having phases of 45, 0, 90, −45 are controlled to be applied to the first to fourth baseband units, respectively.

In the LO signal output process (S130), in the second non-harmonic rejection mode, first to fourth LO signals having phases of 0, 0, 90, 90 are controlled to be applied to the first to fourth up-converters.

Meanwhile, in the above-described processes, some of the processes may be performed. For example, after the RF signal generation process (S140), the phase determination process (S110) may be performed again in consideration of a distortion signal and an amplified signal.

Figure 12:
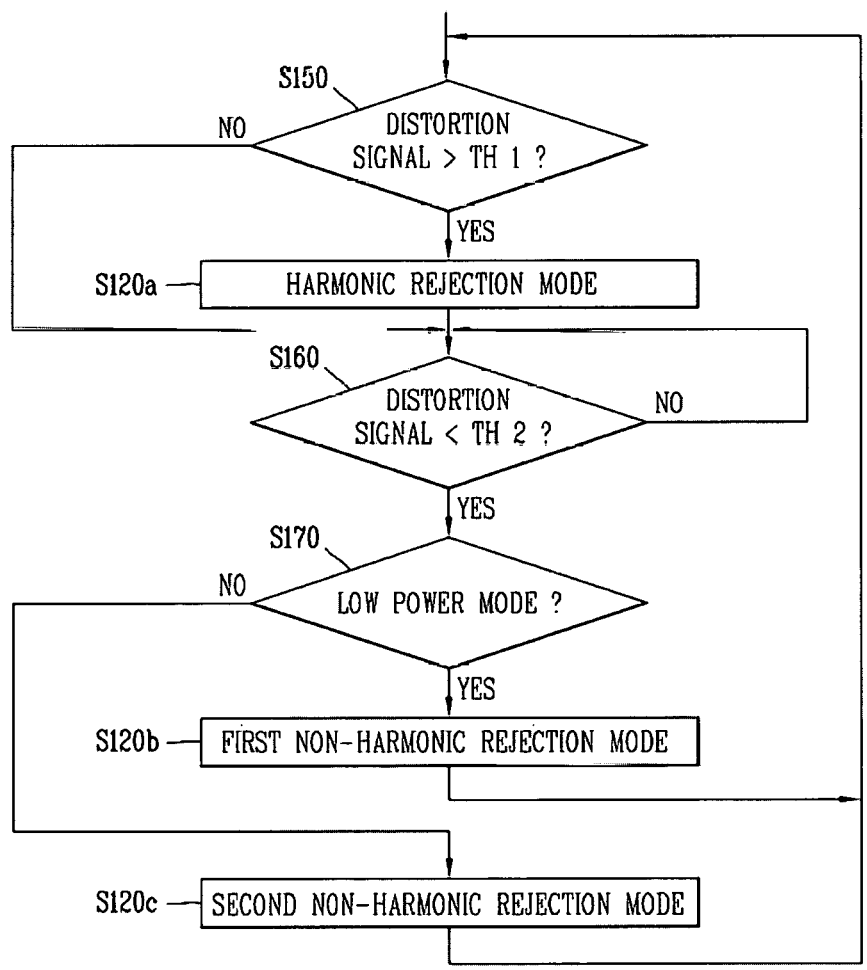
FIG. 12 illustrates a flowchart of a method of controlling harmonics according to an example of the present invention.

In this regard, FIG. 12 illustrates a flowchart of a harmonic control method according to an example of the present invention.

Referring to FIG. 12, after the RF signal generation process (S140), a distortion signal determination process (S150) for determining whether a distortion signal in a frequency band adjacent to the RF frequency band due to an amplified signal of the power amplifier PA is equal to or greater than a first threshold value may be further included. At this time, if it is determined that the distortion signal is equal to or greater than the first threshold value, a harmonic rejection mode S120a for performing the harmonic rejection mode may be performed.

In addition, the method may further include a non-harmonic mode determination process (S160) of determining whether the distortion signal is less than or equal to a second threshold value lower than the first threshold value. At this time, if the distortion signal is less than or equal to the second threshold value (S160) and a mode is a low output mode based on the amplified signal value (S170), the first non-harmonic rejection mode (S120b) for enhancing the SNR may be performed. Meanwhile, if the distortion signal is equal to or less than the second threshold value (S160) and it is determined that the mode is a high power mode based on the amplified signal value (S170), the second non-harmonic rejection mode (S120c) for enhancing the SNR may be performed.

The technical effects of the mobile terminal performing the harmonic control method and the control method thereof according to the present invention are as follows.

According to at least one of the embodiments of the present invention, the transmitting part having improved harmonic distortion characteristics and the mobile terminal having the transmitting part may be provided.

In addition, according to at least one of the embodiments of the present invention, the transmitting part having improved. SNR characteristics and linearity even in the non-harmonic mode while improving harmonic characteristics, and the mobile terminal having the transmitting part may be provided.

Further, according to at least one of the embodiments of the present invention, the mobile terminal including the RF front end with improved harmonic characteristics even in the structure including a plurality of power amplifiers may be provided.

Further scope of applicability of the present invention will become apparent from the following detailed description. It should be understood, however, that the detailed description and specific examples, such as the preferred embodiment of the invention, are given by way of illustration only, since various changes and modifications within the spirit and scope of the invention will be apparent to those skilled in the art.

In relation to the present invention, a method of controlling harmonics of a mobile terminal having a transmitting part can be implemented as computer-readable codes in a program-recorded medium. The computer-readable medium may include all types of recording devices each storing data readable by a computer system. Examples of such computer-readable media may include hard disk drive (HDD), solid state disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). The computer may include the controller 180 of the terminal. Therefore, it should also be understood that the above-described embodiments are not limited by any of the details of the foregoing description, unless otherwise specified, but rather should be construed broadly within its scope as defined in the appended claims, Therefore, all changes and modifications that fall within the metes and bounds of the claims, or equivalents of such metes and bounds are therefore intended to be embraced by the appended claims.

The invention claimed is:

1. A mobile terminal performing harmonic rejection, the mobile terminal comprising:

a plurality of baseband units generating a baseband signal;
a plurality of up-converters converting the baseband signal into a radio frequency (RF) signal; and
a controller controlling phases of a plurality of signals applied to the plurality of baseband units and the plurality of up-converters,
wherein the controller performs at least one of a harmonic rejection mode, a first non-harmonic rejection mode for improving a signal-to-noise ratio (SNR), and a second non-harmonic rejection mode for improving linearity,
wherein the plurality of baseband units include first to fourth baseband units, the plurality of up-converters include first to fourth up-converters, and
wherein in the harmonic rejection mode, the controller controls to apply first to fourth baseband signals having phases of 45, 0, 90, −45 to the first to fourth baseband units, respectively, and to apply first to fourth local oscillator (LO) signals having phases of 45, 0, 90, −45 to the first to fourth up-converters, respectively.

2. The mobile terminal of claim 1, wherein the plurality of up-converters output first to fourth RF signals by up-converting the first to fourth baseband signals and the first to fourth LO signals,
wherein the mobile terminal further comprises:
a power amplifier (PA) amplifying a combined signal obtained by combining the output first to fourth RF signals to provide an amplified signal in an RF frequency band,
wherein when it is predicted that a distortion signal in a frequency band adjacent to the RF frequency band due to the amplified signal is equal to or greater than a first threshold value, the controller controls the phases of the first to fourth baseband signals and the first to fourth LO signals such that the harmonic rejection mode is performed.

3. The mobile terminal of claim 2, wherein when the distortion signal in the frequency band adjacent to the RF frequency band due to the amplified signal is equal to or lower than a second threshold value and a mode is a low output mode based on the amplified signal value, the controller controls the phases of the first to fourth baseband signals and the first to fourth LO signals such that the first non-harmonic rejection mode for improving the SNR is performed, and
wherein the second threshold value is a value lower than the first threshold value.

4. The mobile terminal of claim 2, wherein when the distortion signal in the frequency band adjacent to the RF frequency band due to the amplified signal is equal to or lower than a second threshold value and a mode is a high output mode based on the amplified signal value, the controller controls the phases of the first to fourth baseband signals and the first to fourth LO signals such that the second non-harmonic rejection mode for improving linearity is performed, and
wherein the second threshold value is a value lower than the first threshold value.

5. The mobile terminal of claim 2, further comprising:
a power combiner combining the first to fourth RF signals to output the combined signal; and
a power divider distributing the combined signal in a predetermined power distribution ratio,
wherein the power amplifier includes first to fourth power amplifiers, and
wherein the power divider provides the combined signal to the first to fourth power amplifiers.

6. The mobile terminal of claim 5, wherein when the distortion signal in the frequency band adjacent to the RF frequency band due to the amplified signal is equal to or lower than the second threshold value and the first to fourth power amplifiers are all in an ON state, the controller determines that a mode is a low output mode based on the output per one power amplifier and controls the phases of the first to fourth baseband signals and the first to fourth LO signals such that the first non-harmonic rejection mode for improving the SNR is performed, and
wherein the second threshold value is a value lower than the first threshold value.

7. The mobile terminal of claim 5, wherein when the distortion signal in the frequency band adjacent to the RF frequency band due to the amplified signal is equal to or lower than the second threshold value and at least one of the first to fourth power amplifiers is in an OFF state, the controller determines that a mode is a high output mode based on the output per one power amplifier and controls the phases of the first to fourth baseband signals and the first to fourth LO signals such that the second non-harmonic rejection mode for improving linearity is performed,
wherein the second threshold value is a value lower than the first threshold value.

8. A method of controlling harmonics of a mobile terminal, the method comprising:
a phase determination process of determining phase of a plurality of signals applied to a plurality of baseband units and a plurality of up-converters;
a baseband signal output process of outputting baseband signals on the basis of the determined phases;
a local oscillator (LO) signal output process of outputting LO signals on the basis of the determined phases; and
a radio frequency (RF) signal generation process of generating RF signals using the baseband signals and the LO signals,
wherein, in the phase determination process, phase values of different types are determined according to a harmonic rejection mode, a first non-harmonic rejection mode for improving a signal-to-noise ratio (SNR), and a second non-harmonic rejection mode for improving linearity,
wherein the plurality of baseband units include first to fourth baseband units, and the plurality of up-converters include first to fourth up-converters, and
wherein in the baseband signal output process, in the harmonic rejection mode, first to fourth baseband signals having phases of 45, 0, 90, −45 are controlled to be applied to the first to fourth baseband units, respectively, and
wherein in the LO signal output process, first to fourth LO signals having phases of 45, 0, 90, −45 are controlled to be applied to the first to fourth up-converters, respectively.

9. The method of claim 8, further comprising after the RF signal generation process:
a distortion signal determination process for determining whether a distortion signal in a frequency band adjacent to an RF frequency band due to an amplified signal of a power amplifier PA is equal to or greater than a first threshold value, and
if it is determined that the distortion signal is equal to or greater than the first threshold value, a harmonic rejection mode for performing the harmonic rejection mode is performed, and
wherein the method further comprises a non-harmonic mode determination process of determining whether the distortion signal is less than or equal to a second threshold value lower than the first threshold value, and wherein if the distortion signal is less than or equal to the second threshold value and a mode is a low output mode based on the amplified signal value, the first non-harmonic rejection mode for enhancing the SNR is performed, and wherein if the distortion signal is equal to or less than the second threshold value and it is determined that the mode is a high power mode based on the amplified signal value, the second non-harmonic rejection mode for enhancing the SNR is performed.

\* \* \* \* \*